United States Patent [19]

O'Mara

[11] Patent Number: 4,505,759
[45] Date of Patent: Mar. 19, 1985

[54] METHOD FOR MAKING A CONDUCTIVE SILICON SUBSTRATE BY HEAT TREATMENT OF OXYGENATED AND LIGHTLY DOPED SILICON SINGLE CRYSTALS

[76] Inventor: William C. O'Mara, 111 Main St., Los Altos, Calif. 94022

[21] Appl. No.: 562,845

[22] Filed: Dec. 19, 1983

[51] Int. Cl.³ .................... H01L 21/225; H01L 7/54
[52] U.S. Cl. .................... 148/1.5; 29/576 B; 29/576 T; 148/187; 357/91
[58] Field of Search .......... 148/1.5, 187; 357/91; 29/576 B, 576 T

[56] References Cited

U.S. PATENT DOCUMENTS

| | | | |
|---|---|---|---|
| 4,116,719 | 9/1978 | Shimizu et al. | 148/1.5 |
| 4,220,483 | 9/1980 | Cazcarra | 148/1.5 |
| 4,376,657 | 3/1983 | Nagasawa et al. | 148/1.5 |

FOREIGN PATENT DOCUMENTS

| | | | |
|---|---|---|---|
| 155569 | 6/1982 | German Democratic Rep. | 29/576 T |
| 49532 | 5/1981 | Japan | 29/576 T |
| 199227 | 12/1982 | Japan | 29/576 T |
| 18929 | 2/1983 | Japan | 29/576 T |
| 2080780 | 2/1982 | United Kingdom . | |

OTHER PUBLICATIONS

Wruck et al., Phys. Stat. Sol. 56a (1979) 557.
Glowinke et al., J. Phys. Chem. Solids, 38 (1977) 963.
Kanamori et al., J. Appl. Phys. 50 (1979) 8095.
Hu et al., IBM-TDB, 19 (1977) 4618.
Isomae et al., J. Appl. Phys. 55 (1984) 817.
A. Murgai, et al., "Microdistribution of Oxygen in Silicon," Massachusetts Institute of Technology, Solid-State Science and Technology, May 1980, pp. 1182–1186.
Fuller & Logan, "Effect of Heat Treatment Upon the Electrical Properties of Silicon Crystals," Bell Telephone Laboratories, Inc., Journal of Applied Physics, vol. 28, No. 12, Dec. 1957, pp. 1427–1436.

Primary Examiner—Upendra Roy
Attorney, Agent, or Firm—Thomas Schneck

[57] ABSTRACT

A method for the heat treatment of oxygenated and lightly doped silicon single crystals provides a conductive silicon substrate which draws off stray currents from adjacent n-channel and p-channel transistors, preventing latch-up in CMOS integrated circuits. A lightly doped oxygenated, single crystal silicon wafer is heated at 1000° to 1150° C. to out-diffuse oxygen from the surface layer. After device fabrication on this denuded surface, the wafer is heated at 450° C. to generate oxygen donors in the bulk of the wafer which then becomes strongly conductive or n-type. The wafer surface will remain lightly doped, either n— or p-type from the original doping. By suitable masking during the oxygen out-diffusion step, islands of lightly doped p— or n-type material on the surface may be surrounded by guard rings of strongly conducting n-type material formed in the final heating step at 450° C.

14 Claims, 6 Drawing Figures

METHOD FOR MAKING A CONDUCTIVE SILICON SUBSTRATE BY HEAT TREATMENT OF OXYGENATED AND LIGHTLY DOPED SILICON SINGLE CRYSTALS

CROSS REFERENCE TO RELATED APPLICATION

This is a continuation-in-part of application Ser. No. 426,867 filed Sept. 29, 1982 U.S. Pat. No. 4,459,159.

DESCRIPTION

1. Technical Field

The present invention relates to a thermal method of making improved MOS integrated circuits and in particular to a thermal method of forming a strongly conductive n-type silicon substrate having a lightly doped surface region.

2. Background Art

In the fabrication of high performance CMOS integrated circuits from lightly doped or undoped wafers an undesirable behavior termed "latch-up" may occur. This behavior is equivalent to bipolar transistors with lateral conduction between them. This action can reinforce itself by feedback, drawing greater amounts of current, ultimately causing failure of an integrated circuit. In the past, dielectric isolation or massive oxygen precipitation has been used to prevent this feedback between the complementary adjacent devices.

Fabrication of a highly conductive n-type substrate to drain off stray currents and carry them away from the surface region devices has been a costly and difficult procedure using silicon epitaxy. For example, a strongly n-type wafer would be placed in a chamber for deposition of silicon from the gas phase. The gas stream would contain suitable dopants to give the desired resistivity in the surface layer. A lightly doped surface region is needed for ease of making the MOS devices in the surface layer. This process can be difficult to control.

Electrically isolated islands of lightly doped p- or n-type material in a strongly conducting n-type substrate have required a special in-diffusion process of forming guard rings in the material.

An object of the invention is to devise an improved method for providing a conductive substrate for CMOS devices. The method must be compatible with the procedures used in normal device fabrication and not affect the electrical condition of surface regions containing the CMOS devices.

DISCLOSURE OF INVENTION

The above object has been met by pre- and post-device fabrication annealing of silicon wafers. A way has been found, by electrical activation of oxygen, to make a conductive substrate, while retaining the surface regions, where transistor action occurs, in the usual condition. The conductive substrate drains away charge and current giving rise to latch-up. The pre-device fabrication step involves heating at high temperature, 1000°–1150° C., to produce out-diffusion of oxygen from the surface layer of a lightly doped n- or p-type oxygenated silicon wafer. The wafer is then processed through the various high temperature steps of circuit manufacturing, using the well-known planar process of integrated circuit construction. Subsequently the wafer is heated at 450° C. to generate oxygen donors, an electrically active species, in the bulk of the wafer which then becomes strongly conductive, or n-type. The wafer surfaces will remain lightly doped, either n- or p-type, from the original doping.

Additional optional steps are nucleation for the precipitation of oxygen for gettering or removal of impurities during the fabrication steps and a second high-temperature step which drives the p-n junction farther into the material. These steps are compatible with those actually employed in the CMOS or NMOS device fabrication and the initial out-diffusion step is adjusted to obtain the final desired electrical structure.

Various structures are possible using combinations of the heating steps. A lightly doped p-type surface layer and n-type bulk is achieved from starting with a p-type wafer. A lightly doped n-type surface layer and heavily doped n-type bulk is obtained if the wafer is originally n-type.

The thickness of the surface layer is mainly determined by the amount of out-diffusion. With suitable masking, the out-diffusion of oxygen may be patterned so that islands of lightly doped p- or n-type material on the surface would be surrounded by guard rings of strongly conducting n-type material formed in the final heating step at 450° C.

While the method is primarily directed to the formation of conductive areas to drain off the parasitic currents of the n-channel and p-channels of the CMOS devices, it may also be used to improve circuit operation of the n-channel MOS devices which also are formed from lightly doped or undoped wafers.

BEST MODE FOR CARRYING OUT THE INVENTION

Figure 1:
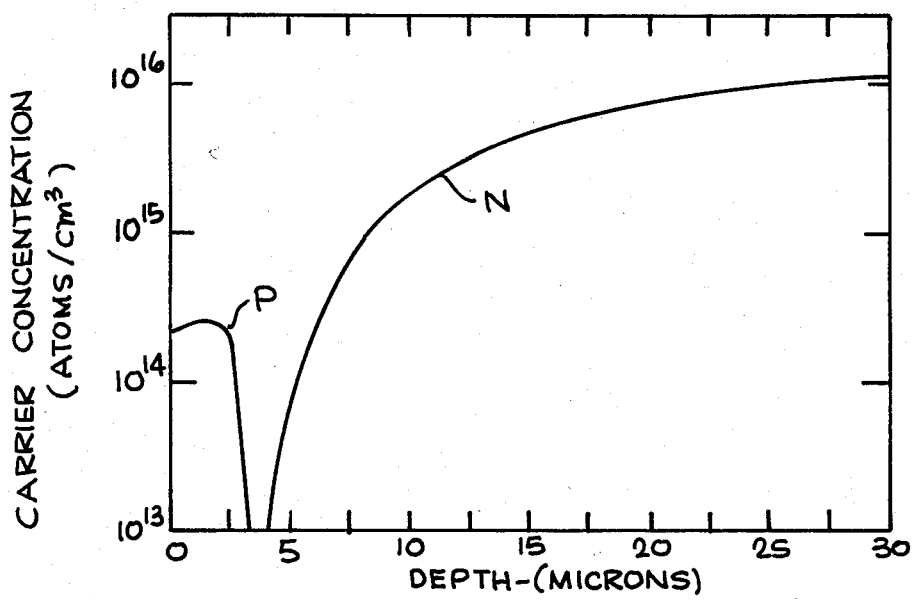
FIGS. 1–3 show the carrier profiles of wafers treated in accordance with the method of the present invention.

Wafers from crystals grown by the Czochralski or Teal-Little technique contain oxygen incorporated during the growth of the crystal due to dissolution of the quartz crucible. The method heats silicon wafers obtained from such crystals in such a manner that the oxygen present in the surface of the wafer out-diffuses. After the high temperature steps of circuit manufacture are completed, the wafer is then heated at 450° C. to create donors from the interstitial oxygen within the wafer bulk. These oxygen donors form at the rate of $10^{13}$ per cc per second at 450° C. at an oxygen level in the bulk of about $1 \times 10^{18}$ atoms per cc. The donors neutralize the dopant acceptors in the wafer if it is a p-type dopant such as boron and then are additionally generated to produce an excess of donors until the substrate of the wafer becomes strongly conducting or n-type. If the wafer has been doped with phosphorus it is originally n-type and the generation of oxygen donors in the substrate is increased until the substrate becomes strongly conducting. Whether the original doping is lightly n- or p-type, the wafer will retain this doping at the surface. No donors are created there because the oxygen has previously been out-diffused from the surface.

The Table below shows a list of heat treatments used in examples of this procedure. The sequence of heat treatments is selected to correspond to processes normally used in CMOS circuit fabrication, demonstrating the feasibility of the invention in actual device manufacturing.

TABLE

| Step | Heat Treatments | | |
|------|-------------|------|-------------|
|      | Temperature | Time | Gas Ambient |
| I    | 1100° C.    | 2 hours  | Nitrogen + Oxygen |
| II   | 750° C.     | 10 hours | Nitrogen |
| III  | 1100° C.    | 20 hours | Nitrogen |
| IV   | 450° C.     | 64 hours | Nitrogen |

Step I as shown in the Table is the denuding step and causes out-diffusion of the oxygen from the surface. Denuding is usually performed in the temperature range of 1,000° to 1,150° C. The depth of the denuding can be precisely set by varying the temperature and time. The denuding step may be performed in an atmosphere of nitrogen gas containing a small percentage of oxygen. The gas has some effect on the rate of oxygen out-diffusion but an oxidizing ambient or argon could also be employed. During the growth of the crystal the material has been lightly doped with a p-type dopant such as boron or an n-type dopant such as phosphorus. The p-type wafer resistivity usually ranges from 40 to 50 ohms-cm. which corresponds to an acceptor concentration of 3.3 to $2.6 \times 10^{14}$ atoms per cc. An n-type wafer, lightly doped, has a resistivity of 9 ohms-cm. corresponding to a donor level of $6 \times 10^{14}$ atoms per cc. The heating of step I does not affect this level of doping but acts to diffuse oxygen from the surface of the wafer to a desired depth into the substrate.

Step II is a nucleation step. This step is sometimes employed to assist in oxygen precipitation during device fabrication. Harmful impurities are gettered or removed from the active device areas during the subsequent oxygen precipitation on the nuclei. Nucleation is ordinarily performed in the temperature range of 600° to 900° C. for a time long enough to reduce the desired density of a nuclei. When the wafer is heated to higher temperatures in subsequent fabrication steps, precipitation of oxygen in the crystal structure occurs at the nuclei clusters.

Step III is similar to a high-temperature step used to drive in a p-well diffused layer in CMOS fabrication. This step may occur as part of the high-temperature processing during the actual circuit manufacture. However, some CMOS or NMOS processes would use different temperatures and times during processing. These processes are generally known as the "planar process" of integrated circuit manufacturing. A general description of the planar process is set forth in the book "Analog Integrated Circuit Design" by A. Grebene, p. 2. A general description of MOS device construction is set forth in the book "MOS/LSI Design and Application" by W. Carr and J. Mize. Integrated circuit construction is carried out in the usual way after steps I and II. Adjustments in the initial heating of step I are needed to give the final desired electrical structure or depth of a surface layer. Step III is termed the drive-in step since it is used to drive in the surface layer.

The last step, IV, is termed the donor formation step. Heating at 450° C. produces donors due to oxygen present in the substrate bulk. The surface layer in which the oxygen has been out-diffused will contain no donors. When the donors are formed, they are stable at temperatures below 450° C. It is important that this is the last heating step in the device manufacturing, since heating at temperatures higher than 500° or so can eliminate the donors formed in this step. The length of heating time at this step can be varied according to the amount of conductivity desired in the substrate structure. The rate of donor formation depends strongly on the amount of oxygen present. For wafers containing oxygen at a level of 8 to $10 \times 10^{17}$ atoms per cc, the rate of donor formation is in the vicinity of $10^{13}$ per cc per second. If fewer donors are required, the time of heating of step IV may be less than the 64 hours shown in the Table. The gas ambient does not strongly influence the formation of donors. In the examples shown, nitrogen was used for steps II–IV. The temperature range for donor formation is 450° C. ±50° C. In addition, a "new" donor can be formed at 800° C. by heating for much longer times.

With reference to FIG. 1 a carrier profile from surface to bulk is shown for a wafer subjected to heat treatment steps I and IV. The wafer crystal was originally doped with boron to a p-type material having an oxygen concentration of $8.7 \times 10^{17}$ atoms per cc, as measured by infrared absorption using ASTM procedure F121-80. The wafer resistivity ranged from 40–50 Ωcm which corresponds to acceptor concentration of $3.3–2.6 \times 10^{14}$ atoms per cc. The wafers were 100 mm diameter and 100 orientation. Spreading resistance measurements on angle-lapped samples of the wafer show that the resistivity of the surface corresponds to the original doping and the material retains its p-type characteristic in this region. In the body or bulk of the wafer substrate, however, donors formed by the heat treatment neutralize the electrical activity of the lightly p-doped region and an excess of donors causes the bulk material to become n-type with a carrier concentration of $1 \times 10^{16}$ atoms/cc. This corresponds to a resistivity of 0.6 ohm-cm. A p-n junction at a distance of about 4 microns from the surface occurs because the donor level diminishes where the oxygen has been out-diffused. The depth of this junction from the surface is primarily dependent on step I but is influenced by subsequent heat treatments such as step III.

Figure 2:
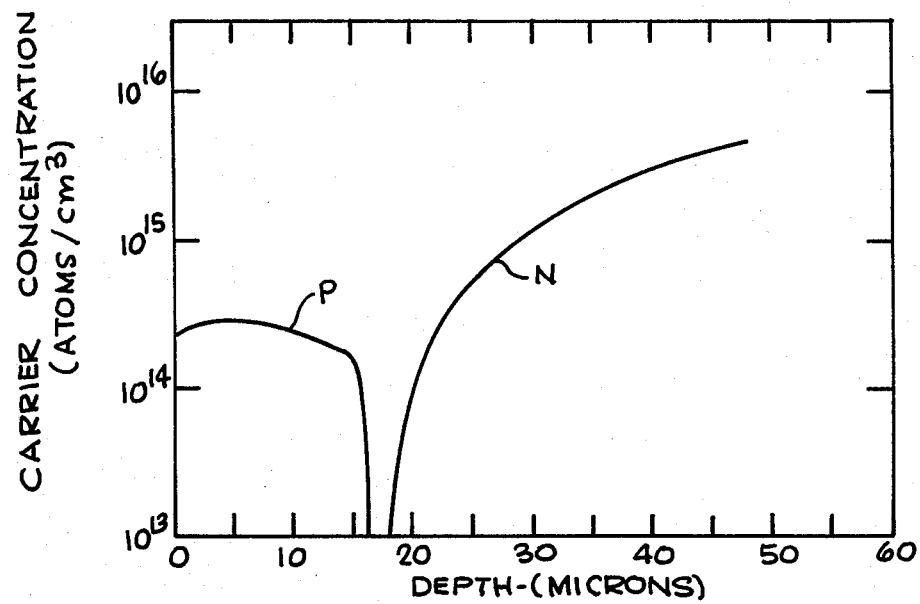

FIG. 2 shows results for a wafer after steps I, III and IV. The high heat treatment as used in circuit manufacture and shown as step III apparently causes precipitation of oxygen in the crystal structure. For this reason, the overall level of donors in the bulk is reduced and the p-n junction is moved further into the material, at a level of about 16 microns from the surface. If a nucleation heat treatment corresponding to step II is employed in the device fabrication procedure, such oxygen precipitation will be assisted by the formation of the nuclei.

Figure 3:
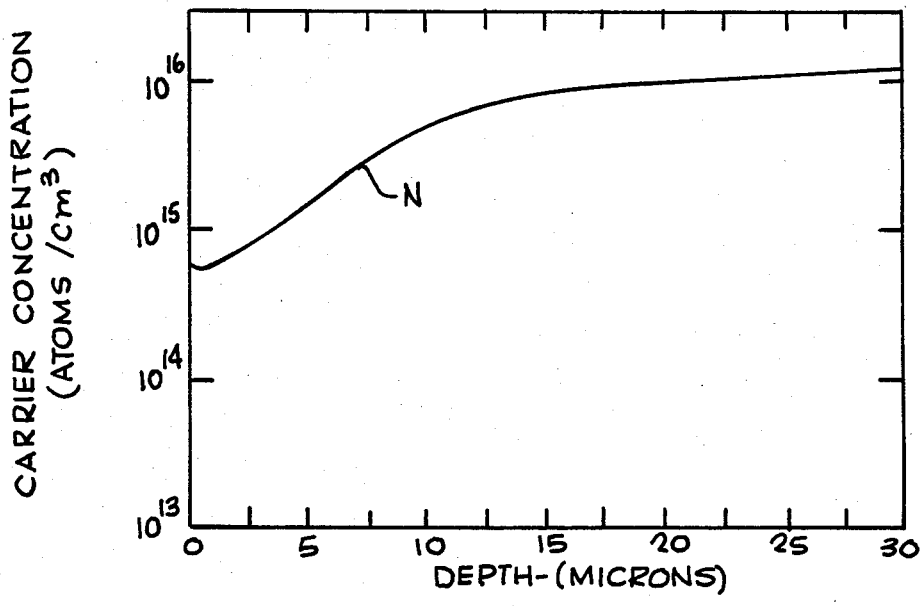

FIG. 3 shows results obtained in an n-type wafer. The original doping corresponded to about 9 ohm-cm. The wafer was processed through heat treatment steps I and IV. As shown, this results in a lightly doped n-type surface region due to the original doping, and a strongly conducting bulk region containing donors due to oxygen.

The important features of the present method are those in steps I and IV. In step I the thickness of the surface region is determined although it is influenced by subsequent high temperature steps. This important step removes oxygen from the surface by out-diffusion. Then the remaining oxygen in the bulk forms donors by heating at 450° C. This excess of donors in the substrate creates a strongly n-type material. Stray currents between adjacent devices formed on the surface of the wafer flow into the strongly n-type material and are carried away. The surface region remains lightly doped for ease in making MOS devices in this layer prior to the final heating of step IV.

Figure 4:
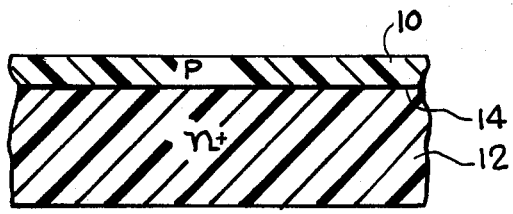
FIGS. 4–6 are schematic representations of semiconductor structures made in accordance with the method of the present invention.

FIG. 4 shows a semiconductor structure formed by the application of the method to a p-type wafer material. The surface layer 10 of a silicon wafers remains p-type containing $2 \times 10^{14}$ carriers per cc. The bulk 12 of the silicon wafer substrate becomes n-type with $1 \times 10^{16}$ carriers per cc due to the creation of an excess of oxygen donors in the substrate by step IV. A p-n junction 14 is formed at the interface between the p and n materials. The surface p-type layer 10 remains that way because the oxygen was out-diffused from that area in step I, leaving no supply for donor formation in that area.

Figure 5:
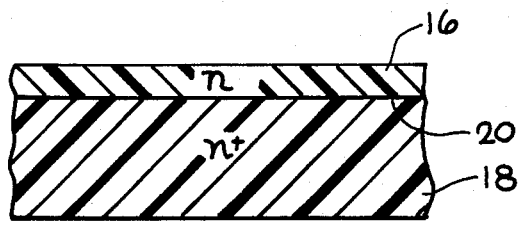

FIG. 5 shows the type of structure obtainable from an original n-type wafer. Surface layer 16 remains lightly doped n-type containing $6 \times 10^{14}$ carriers per cc. The bulk 18 of the wafer substrate becomes heavily doped n-type containing $1 \times 10^{16}$ carriers per cc. An N-N+ junction 20 is formed between the two areas due to the difference in the original level of doping of the surface layer and the donors activated in the bulk.

Figure 6:
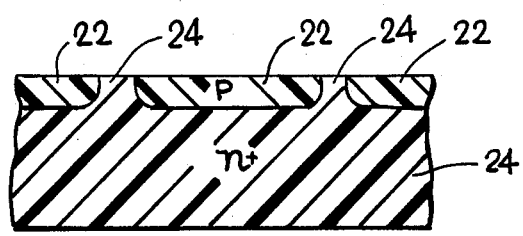

FIG. 6 shows a structure that can be formed using a mask on the wafer surface during the out-diffusion of the oxygen in step I. A suitable mask, such as silicon nitride, could be deposited and patterned using normal techniques. The mask material would block the out-diffusion of oxygen in the masked areas, allowing the formation of islands 22 of lightly doped p- or n-type material according to the starting material doping. These islands would be electrically isolated or grounded by by strongly conducting n-type material 24 formed in step IV. This allows guard rings to be prepared in the material without a special in-diffusion process.

Other structures are possible due to the ability to form stable donors in silicon which contains oxygen by heating the material at 450° C.

The method is reproducible for wafers containing the same original oxygen concentration and processed through the same steps. The p-n junction depth and the bulk resistivity will be nearly the same.

The method results in a highly conductive silicon bulk substrate under the surface MOS devices. Stray currents are drawn off from the adjacent n-channel and p-channel transistors preventing latch-up.

What is claimed is:

1. A method for making a conductive substrate for semiconductor devices comprising,
   (a) forming an oxygenated, doped single-crystal silicon wafer substrate, having opposite major surfaces and having semiconductor electrical conductivity,
   (b) heating the substrate at a temperature between 1,000°–1,150° C. to deplete the substrate surfaces of oxygen,
   (c) fabricating semiconductor devices on one of the substrate surfaces by planar processing, and then
   (d) heating the substrate to a temperature of about 450° C. until the bulk of the substrate between the surfaces becomes highly conductive.

2. The method of claim 1 wherein the substrate surface is masked in patterned regions to block depletion of oxygen from patterned regions in said surface.

3. The method of claim 1 wherein said heating of the substrate to between 1,000°–1,150° C. is followed by heating between 600°–900° C. to form oxygen precipitation nuclei in the substrate.

4. The method of claim 1 wherein said heating of the substrate to between 1,000°–1,150° C. is followed by a heating step at 1,100° C. whereby oxygen precipitates in the substrate bulk.

5. The method of claim 1 wherein said crystal silicon wafer substrate is doped to have a semiconductor electrical conductivity of the p-type, the surface of said substrate remaining p-type after the final heating step at 450° C. and the substrate bulk becoming n-type by the generation of oxygen donors in the substrate bulk.

6. The method of claim 1 wherein said crystal silicon wafer substrate is doped so as to have a semiconductor electrical conductivity of the n type, the surface of said substrate retaining the original n-type doping after heating at 450° C. and the substrate bulk gaining increased n-type conductivity by the creation of oxygen donors in the heating step.

7. The method of claim 1 wherein said fabricating of semiconductor devices consists of creating a plurality of localized regions in said surface opposite in polarity to adjacent surface regions, thereby forming p-n junctions, the p-n junctions being separated from each other for electro-isolation, said device being formed on an oxygen-depleted surface of the substrate.

8. The method of claim 1 wherein said fabricating of semiconductor devices consists of creating a plurality of localized regions in said surface opposite in polarity to adjacent surface regions, thereby forming n-n junctions, the n-n junctions being separated from each other for electro-isolation, said device being formed on an oxygen-depleted surface of the substrate.

9. The method of claim 4 wherein said heating step occurs during device manufacture on the substrate surface.

10. A method for making a conductive silicon substrate for semiconductor devices comprising,
    (a) forming an oxygenated, doped, single-crystal silicon wafer substrate, having opposite major surfaces and having semiconductor electrical conductivity,
    (b) depleting the surface of said substrate of oxygen by heating the substrate at a temperature between 1,000°–1,150° C. for a length of time sufficient to obtain the desired depth of oxygen-depleted surface layer,
    (c) fabricating semiconductor devices on one of the substrate surfaces by planar processing, and then
    (d) forming oxygen donors in the substrate bulk by heating the substrate to a temperature of about 450° C. until the substrate bulk becomes highly conductive and a semiconductor electrical conductivity type junction occurs at the interface between an oxygen-depleted surface layer and the bulk of the substrate.

11. The method of claim 10 wherein CMOS, NMOS, or bipolar semiconductor devices are fabricated in the oxygen-depleted surface layer prior to the creation of oxygen donors in the bulk at 450° C.

12. The method of claim 10 wherein a mask material is deposited on said substrate surface prior to depletion of the surface of oxygen, said masked areas retaining oxygen for subsequent donor formation at 450° C. whereby said surface masked areas become highly conductive.

13. A method for making a conductive substrate for semiconductor devices comprising,
    (a) forming an oxygenated, doped single-crystal silicon wafer substrate, having opposite major surfaces and having semiconductor electrical conductivity, (b) fabricating semiconductor devices on one of the substrate surfaces by planar processing, and then (c) heating the substrate to a temperature of about 450° C. until the bulk of the substrate between the surfaces becomes highly conductive.

14. A method for making a conductive substrate for semiconductor devices comprising, (a) forming an oxygenated, doped single-crystal silicon wafer substrate, having opposite major surfaces and having semiconductor electrical conductivity, (b) heating the substrate at a temperature between 1,000°–1,150° C. to deplete the substrate surfaces of oxygen, (c) fabricating semiconductor devices on one of the substrate surfaces by planar processing, and then (d) heating the substrate to a temperature in the range of between 500°–800° C. until the bulk of the substrate between the surfaces becomes highly conductive.

* * * * *